United States Patent [19]
Greer

[11] Patent Number: 6,167,284
[45] Date of Patent: Dec. 26, 2000

[54] DEVICE FOR CONVERTING A SYMMETRICAL SIGNAL INTO AN ASYMMETRICAL SIGNAL

[75] Inventor: Nigel Greer, Caen, France

[73] Assignee: U.S. Philips Corporation, New York, N.Y.

[21] Appl. No.: 09/158,626

[22] Filed: Sep. 22, 1998

[30] Foreign Application Priority Data

Sep. 23, 1997 [FR] France .................................. 97 11831

[51] Int. Cl.$^7$ ...................................................... H04B 1/00
[52] U.S. Cl. ........................................... 455/550; 455/575
[58] Field of Search ..................................... 329/329, 330, 329/331, 332, 333, 334, 335; 455/289, 305, 326, 327, 328; 327/407, 411, 52, 53; 330/252, 253, 257

[56] References Cited

U.S. PATENT DOCUMENTS 4,464,591 8/1984 Rapp ........................................ 307/530
6,073,002 6/2000 Peterson .................................. 455/326

OTHER PUBLICATIONS

Sedra et al. (Microelectronic Circuits, ISBN 0–03–007328–6 Holt, Rinehart and Winston, © 1987).
SA1620 Data Sheet, Philips Semiconductors, May 1997.
SA1630 Data Sheet, Phillips Semiconductors, Jul. 1998.
By Messrs. Paul Horowitz and Winfield Hill, "The Art of Electronics" Published by the Press Syndicate of the University of Cambridge, pp. 96,97,98,99,100.
By O'Dell, T. H. "Wideband Difference Amplifier" Electronic Engineering, vol. 68, No. 834, Jun. 1996, pp. 33, Figure 3.
By M.G.R. Degrauwe et al. "IDAC: An Interactive Design Tool for Analog CMOS Circuits" IEEE Journal of Solid–State Circuits, vol. SC–22, No. Dec. 6, 1987, pp. 1106–1116,; Figures 2, 12.

*Primary Examiner*—Reinhard J. Eisenzopf
*Assistant Examiner*—Makoto Aoki
*Attorney, Agent, or Firm*—Dicran Halajian

[57] ABSTRACT

A converter device with a symmetrical device input and an asymmetrical device output has a transconductance input module that converts the device input voltage to an output current. A resistive module transforms the output current into a voltage referenced a predetermined potential. The transconductance input module has two transistors forming a differential pair and a subtracter connected between the differential pair outputs and the resistive module. The subtracter has three current mirrors and provides the resistive module with a current which is the difference between transfer currents of the two transistors of the differential pair. A second differential pair is provided between the device input and the first differential pair.

5 Claims, 2 Drawing Sheets

DEVICE FOR CONVERTING A SYMMETRICAL SIGNAL INTO AN ASYMMETRICAL SIGNAL

FIELD OF THE INVENTION

The present invention relates to a converter device having a symmetrical input intended to receive an input voltage, and an asymmetrical output intended to deliver an output voltage, comprising:

- a transconductance module having a symmetrical input forming the input of the device, and an output intended to deliver a current whose value is linked with that of the input voltage, and
- a resistive module intended to transform the output current of the transconductance module into a voltage referenced to a predetermined potential.

BACKGROUND OF THE INVENTION

Such converter devices are currently used in apparatus which include a plurality of integrated circuits fed by a common ground-referenced supply voltage and which are interconnected by a printed circuit such as, for example, radio telephones. Actually, preferably symmetrical voltage signals are managed in certain integrated circuits, notably for reasons of noise reduction, which is made possible thanks to the symmetry of the structures which result from the symmetry of the signals. These symmetrical signals are preferably referenced to the supply voltage, which is often produced by a battery and thus subject to variations. The signals in transit between two integrated circuits via the printed circuit are to be of an asymmetrical type and referenced to ground common to all the circuits.

Known converter devices are mostly formed by arrangements based on operational amplifiers. Thus, a conventional converter device uses an operational amplifier arranged as a differential amplifier which generates an asymmetrical type of voltage which is representative of the symmetrical input voltage, followed by an operational amplifier commanding the conduction of a current, which is proportional to the output voltage of the differential amplifier, through a resistor connected to the ground terminal of the circuit. Such arrangements are described in the book entitled "The Art of Electronics" by Messrs. Paul Horowitz and Winfield Hill. The converter device as described above has the following major drawbacks: each operational amplifier is in itself a complex circuit comprising up to several dozen transistors. The use of such a device necessitates the use of a large silicon surface which renders it costly. In addition, when the operational amplifiers are subjected to variations of their supply voltage, they are likely to introduce a parasitic DC component in the output voltage which component may be harmful to the proper operation of the apparatus.

It is an object of the invention to largely remedy these drawbacks by proposing a converter device that has a simpler structure, calling for a reduced number of components while having a reduced sensitivity relative to variations of the supply voltage.

SUMMARY OF THE INVENTION

Indeed, a converter device according to the present invention, has a transconductance module which includes:

- a first and a second transistor forming a differential pair, each having a reference terminal, a bias terminal and a transfer terminal, the bias terminals forming the symmetrical input of the device, and
- subtracter means having two inputs intended to receive currents called transfer currents delivered by the transfer terminals of the first and second transistors, and one output connected to the output of the transconductance module and intended to deliver a current that is representative of the difference between the transfer currents.

In such a converter device, the differential pair immediately transforms the input voltage into a differential current on which possible variations of the supply voltage can have but a slight influence. Besides, the transconductance module according to the invention includes no more than a single differential pair instead of the two operational amplifiers described previously, and the subtracter means.

An embodiment of the invention features a converter device includes subtracter means with three current mirrors. This embodiment of the subtracter means is advantageous because of its simplicity and enables an all the less costly embodiment of the converter device. Converter device also includes a resistive module which may be implemented in a very simple form. The resistive module has means for connecting the first terminal of the output resistor to a predetermined potential.

In a preferred embodiment of the invention, the means for connecting the first terminal of the output resistor to the predetermined potential includes a current source with two additional transistors.

The linearity of the transformation of the input voltage into a differential current by the differential pair formed by the first and second transistors may be altered when the amplitude of the input voltage is sufficiently high to saturate said transistors. A variant of the invention enables to correct this phenomenon.

As described previously, a converter device according to the invention is particularly well adapted to being used in a radio telephone.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
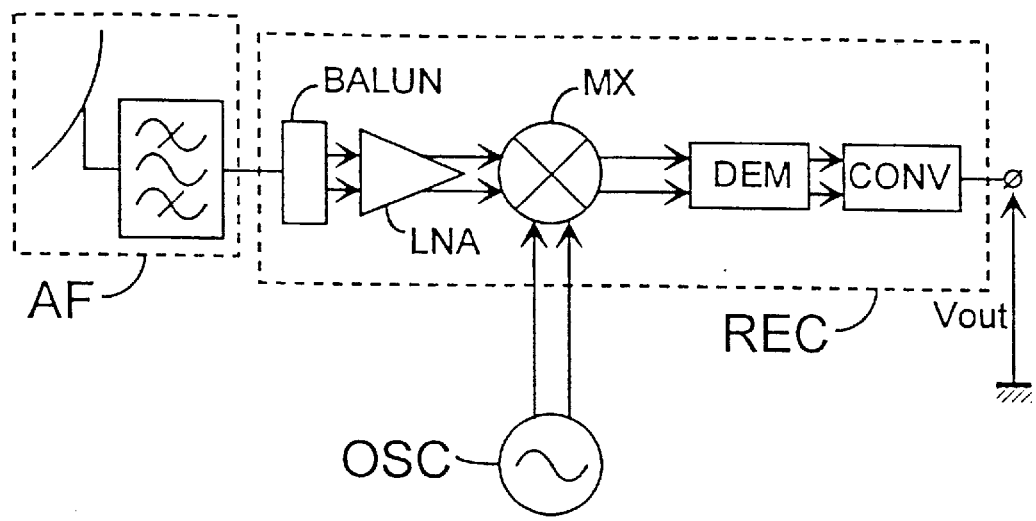
FIG. 1 is a function diagram describing a radio telephone which includes a converter device according to the invention.

FIG. 1 diagrammatically represents a radio telephone which includes:

- an antenna and filter system AF intended to ensure the reception of a radio signal and to deliver on an output an asymmetrical voltage signal that represents said signal,
- a balancing transformer BALUN having an input connected to the output of the antenna and filter system AF, and a symmetrical output,
- an amplifier LNA having a symmetrical output and a symmetrical input connected to the output of the balancing transformer BALUN, a mixer MX having one symmetrical output, a first symmetrical input connected to the output of the amplifier LNA and a second symmetrical input intended to receive a voltage signal coming from a local oscillator OSC, and a demodulator DEM having a symmetrical output, and a symmetrical input connected to the output of the mixer MX.

The function of the balancing transformer BALUN is to transform the signal delivered by the antenna and filter system AF into a symmetrical signal. It also ensures an adaptation of the impedance with the amplifier LNA. The balancing transformer BALUN, the amplifier LNA, the mixer MX and the demodulator DEM are preferably put together inside the same integrated circuit REC called receiver circuit. Because of the symmetry of the signals processed by the elements that have been described previously, the circuits in the form of which these elements are implemented have a symmetrical structure which enables to eliminate by compensation a large number of noise components which are inherent in the processed signals. Besides, the receiver circuit being fed with a supply voltage referred to a ground which is common to all the components of the radio telephone, which are interconnected by means of a printed circuit, these signals are referenced to the supply voltage. The signals in transit via the printed circuit are to be asymmetrical and referenced to the circuit common ground. The apparatus thus includes a converter device CONV whose symmetrical input is connected to the output of the demodulator DEM and whose output is intended to deliver a demodulated output voltage Vout of asymmetrical type and referenced to ground.

Figure 2:
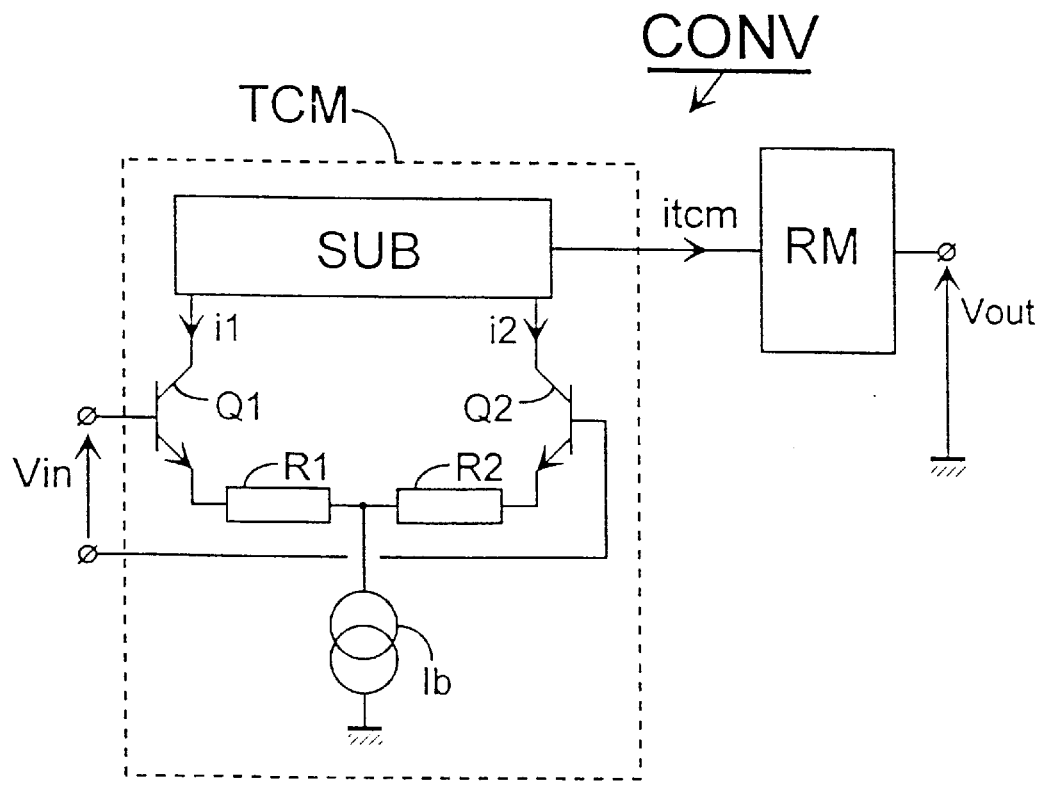
FIG. 2 is a function diagram describing a converter device according to the invention.

FIG. 2 diagrammatically represents such a converter device CONV. This converter device CONY has a symmetrical input intended to receive an input voltage Vin and an asymmetrical output intended to deliver an output voltage Vout. It comprises:

a transconductance module TCM having a symmetrical input forming the input of the device, and an output intended to deliver a current itcm whose value is linked with that of the input voltage Vin, and a resistive module RM intended to transform the output current item of the transconductance module TCM into a voltage Vout referenced to ground.

This converter device CONV is characterized in that the transconductance module TCM includes:

a first and a second bipolar transistor Q1 and Q2 forming a differential pair, each having an emitter forming a reference terminal, a base forming a bias terminal and a collector forming a transfer terminal, the bases forming the symmetrical input of the device, and subtracter means SUB having two inputs intended to receive currents called transfer currents i1 and i2 delivered by the collectors of the first and second transistors Q1 and Q2, and one output connected to the output of the transconductance module TCM and intended to deliver a current itcm that is representative of the difference between the transfer currents i1 and i2. The current itcm, which may be equal to i1–i2, is proportional to the input voltage Vin. This transformation of voltage to current is largely independent of the variations of the supply voltage.

Degeneracy resistors R1 and R2 make the transformation of voltage to current linear when the first and second transistors Q1 and Q2 operate outside their state of saturation.

Figure 3:
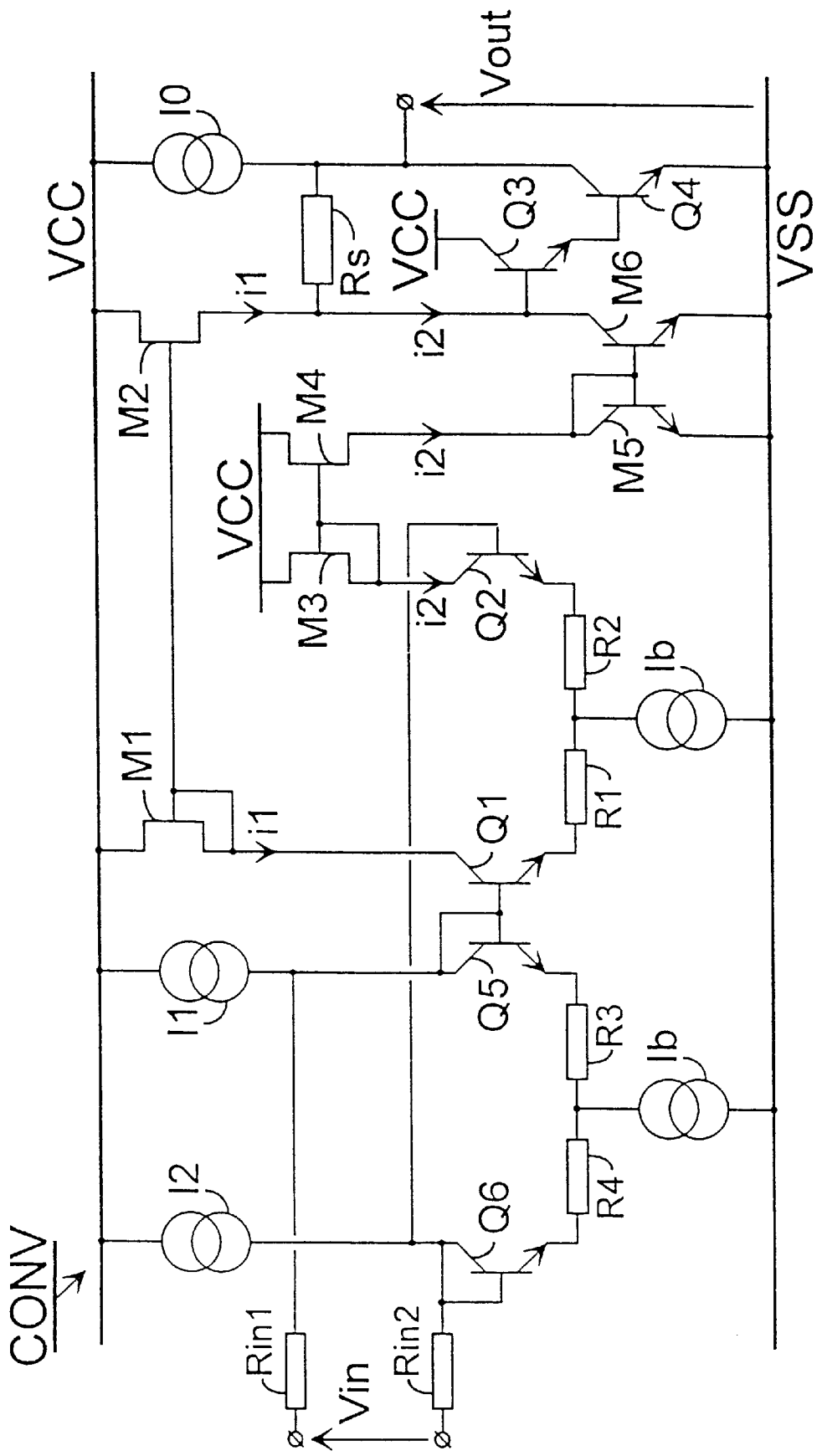
FIG. 3 is an electric circuit diagram describing a converter device according to the preferred embodiment of the invention.

FIG. 3 represents a preferred embodiment of the invention. As far as possible, the references relating to elements already described above are retained in order to facilitate the understanding of the explanation. In this embodiment, the subtracter means include:

a first and a second current mirror, (M1, M2) and (M3, M4), respectively, each having an input branch, an output branch and a reference terminal connected to a first supply terminal VCC, the input branches of the first and second current mirrors being connected to the transfer terminals of the first and second transistors Q1 and Q2, and a third current mirror (M5, M6), whose reference terminal is connected to a second supply terminal VSS which forms the ground terminal of the circuit, the third current mirror whose input branch is connected to the output branch of the second current mirror, the output branches of the first and third current mirrors (M1, M2) and (M5, M6) being connected together to the output of the transconductance module.

The resistive module includes:

a resistor Rs called output resistor of which a first terminal is connected to the output of the transconductance module, that is to say, to the output branches of the first and third current mirrors (M1, M2) and (M5, M6), and of which a second terminal forms the output of the converter device CONV, and means for setting the first terminal of the output resistor Rs of a predetermined potential.

According to this embodiment of the invention, the transfer current i1 flowing through the collector of the first transistor Q1 is reproduced on the output branch of the first current mirror (M1, M2), whereas the transfer current i2 flowing through the collector of the second transistor Q2 is reproduced on the output branch of the second current mirror (M3, M4), and after that on the output branch of the third current mirror (M5, M6). The output resistor Rs of the resistive module is thus passed through by a current equal to i1–i2 and is thus proportional to the input voltage Vin if the input stage (Rin1, Rin2, I1, I2, Q5, Q6, R3, R4), of which the usefulness will be described in the following of the description, is ignored. Thus, the potential of the first terminal of the output resistor Rs being fixed, said resistor Rs produces a voltage drop that is proportional to the AC component of the voltage Vin. The output voltage Vout which results therefrom is thus a voltage of asymmetrical kind referenced to the predetermined potential.

The means for setting the first terminal of the output resistor at the predetermined potential include:

a current source 10 arranged between the first supply terminal VCC and the output of the device, a third transistor Q3, whose base and collector are respectively connected to the first terminal of the output resistor Rs and to the first supply terminal VCC, and a fourth transistor Q4, whose base is connected to the emitter of the third transistor Q3, whose emitter is connected to the second supply terminal VSS and whose collector is connected to the output of the converter device CONV.

According to this embodiment, the potential of the first terminal of the output resistor Rs is equal to 2.Vbe+VSS, if Vbe represents a base-emitter voltage common to the third and fourth transistors Q3 and Q4. These being biased by means of the current source IO supplying a current of fixed value, their base-emitter voltages are also fixed, which causes the potential of the first terminal of the output resistor Rs to be fixed. The output voltage Vout is thus a voltage of asymmetrical type, whose AC component is proportional to the variations of the input voltage Vin, and whose DC component is constantly equal to 2.Vbe+VSS. The output voltage Vout is thus referenced to ground.

A proper linearity of the voltage-to-current transformation may be obtained, when the input stage (Rin1, Rin2, I1, I2, Q5, Q6, R3, R4) is absent, by choosing for the degeneracy resistors R1, R2 a nominal value of the order of several tens of kOhms, but these resistors then create considerable voltage drops.

The input stage (Rin1, Rin2, I1, I2, Q5, Q6, R3, R4) makes it possible to reduce the unwanted effects which too large amplitude variations of the input voltage Vin may have on the transformation from voltage to current performed by the transconductance module. Indeed, if the differential pair (Q1, Q2) directly receives an input voltage Vin having a sufficient amplitude for saturating one of the first or second transistors Q1 or Q2, the transfer currents i1 and i2 will be such that their difference will no longer be proportional to the input voltage Vin. Therefore, in this preferred embodiment of the invention, the converter device CONV comprises, inserted between the differential pair formed by the first and second transistors Q1 and Q2 and the symmetrical input of the device, a second differential pair formed by a fifth and a sixth transistor Q5 and Q6, whose bases are connected respectively to the bases of the first and second transistors Q1 and Q2, whose collectors are connected to the first supply terminal VCC via loads, each of the fifth and sixth transistors Q5 and Q6 having its base connected to its collector as well as to a first terminal of an input resistor Rin1 or Rin2, the second terminals of said input resistors Rin1 and Rin2 forming the symmetrical input of the converter device CONV.

The strings of elements (Rin1, Q5, Q3) and (Rin2, Q6, R4) form a differential divider bridge. The value of the voltage that flows to the bases of the first and second transistors Q1 and Q2 is thus but a fraction of that of the input voltage Vin, which limits the risks of saturation of said transistors. By fixing the nominal values of the input resistors Rin1 and Rin2 to several tens of kOhms, nominal values of the order of one kOhm for the degeneracy resistors R1, R2, R3, and R4 make it possible to obtain optimum linearity without inasmuch creating prohibitive voltage drops.

The loads of the fifth and sixth transistors Q5 and Q6 are here current sources, I1 and I2. This enables to ensure a biasing of said transistors which is independent of the input voltage Vin and not of the variations of said voltage, which would not be the case if the loads were resistors.

Finally, if the transistors Q1, Q2, Q3, Q4, Q5, Q6, M5 and M6 have been represented in the form of bipolar transistors in this example, it will be evident to those skilled in the art that transistors of the MOS type whose drains would form the transfer terminals, the sources the reference terminals and the gates the bias terminals, could have substituted them. The reverse is true for transistors M1, M2, M3 and M4.

What is claimed is:

1. A converter device having a symmetrical device input to receive an input voltage, and an asymmetrical device output to deliver an output voltage, comprising:
    a transconductance module having a symmetrical transconductance input forming the device input, and a transconductance output to deliver an output current which is proportional to the input voltage, and
    a resistive module to transform the output current of the transconductance module into a voltage referenced to a predetermined potential,
    wherein said transconductance module includes:
        a first and a second transistor forming a differential pair, each having a reference terminal, a bias terminal and a transfer terminal, the bias terminals forming the symmetrical device input, and
        subtracter means having two inputs to receive transfer currents delivered by the transfer terminals of the first and second transistors, and one output connected to the output of the transconductance module to deliver a current that is representative of the difference between the transfer currents,
    and wherein the subtracter means include:
        a first and a second current mirror, each having an input branch, an output branch and a reference terminal connected to a first supply terminal, the input branches of the first and second current mirrors being connected to the transfer terminals of the first and second transistors, and
        a third current mirror having a reference terminal which is connected to a second supply terminal, and having an input branch which is connected to the output branch of the second current mirror, the output branches of the first and third current mirrors being connected together to the output of the transconductance module,
    and wherein the resistive module includes:
        an output resistor having a first terminal which is connected to the output of the transconductance module, and having a second terminal which forms the device output, and
        means for setting the first terminal of the output resistor to the predetermined potential.

2. A converter device as claimed in claim 1, wherein the means for setting the first terminal of the output resistor to the predetermined potential include:
    a current source arranged between the first supply terminal and the device output,
    a third transistor having bias and transfer terminals which are respectively connected to the first terminal of the output resistor and to the first supply terminal, and
    a fourth transistor having a bias terminal which is connected to the reference terminal of the third transistor, and having a reference terminal which is connected to the second supply terminal, and having a transfer terminal which is connected to the device output.

3. A converter device having a symmetrical device input to receive an input voltage, and an asymmetrical device output to deliver an output voltage, comprising:
    a transconductance module having a symmetrical transconductance input forming the device input, and a transconductance output to deliver an output current which is proportional to the input voltage, and
    a resistive module to transform the output current of the transconductance module into a voltage referenced to a predetermined potential,
    wherein said transconductance module includes:
        a first and a second transistor forming a differential pair, each having a reference terminal, a bias terminal and a transfer terminal, the bias terminals forming the symmetrical device input, and
        subtracter means having two inputs to receive transfer currents delivered by the transfer terminals of the first and second transistors, and one output connected to the output of the transconductance module to deliver a current that is representative of the difference between the transfer currents, and wherein the subtracter means include:

a first and a second current mirror, each having an input branch, an output branch and a reference terminal connected to a first supply terminal, the input branches of the first and second current mirrors being connected to the transfer terminals of the first and second transistors, and a third current mirror having a reference terminal which is connected to a second supply terminal, and having an input branch which is connected to the output branch of the second current mirror, the output branches of the first and third current mirrors being connected together to the output of the transconductance module, said converter device including a second differential pair which is inserted between the differential pair formed by the first and second transistors and the symmetrical device input, said second differential pair being formed by a fifth and a sixth transistor, and having bias terminals which are respectively connected to the bias terminals of the first and second transistors, and having transfer terminals which are connected to the first supply terminal via loads, each of the fifth and sixth transistors having its bias terminal connected to its transfer terminal as well as to a first terminal of an input resistor, the second terminals of said input resistors forming the symmetrical device input.

4. A radio telephone which includes:

an antenna and filter system to ensure the reception of a radio signal and to deliver on an output an asymmetrical voltage signal that represents said signal, a balancing transformer having an input connected to the output of the antenna and filter system, and a symmetrical output, an amplifier having a symmetrical output and a symmetrical input connected to the output of the balancing transformer, a mixer having one symmetrical output, a first symmetrical input connected to the output of the amplifier and a second symmetrical input to receive a voltage signal coming from a local oscillator, and a demodulator having a symmetrical output, and a symmetrical input connected to the output of the mixer, wherein said radio telephone further includes a converter device as claimed in claim 3 having the symmetrical device input being connected to the output of the demodulator and having the device output deliver a demodulated output signal of asymmetrical type.

5. A radio telephone which includes:

an antenna and filter system to ensure the reception of a radio signal and to deliver on an output an asymmetrical voltage signal that represents said signal, a balancing transformer having an input connected to the output of the antenna and filter system, and a symmetrical output, an amplifier having a symmetrical output and a symmetrical input connected to the output of the balancing transformer, a mixer having one symmetrical output, a first symmetrical input connected to the output of the amplifier and a second symmetrical input to receive a voltage signal coming from a local oscillator, and a demodulator having a symmetrical output, and a symmetrical input connected to the output of the mixer, wherein said radio telephone further includes a converter device as claimed in claim 5 having the symmetrical device input being connected to the output of the demodulator and having the device output deliver a demodulated output signal of asymmetrical type.

* * * * *